(12) United States Patent
Aipperspach et al.

(10) Patent No.: US 7,092,281 B1
(45) Date of Patent: Aug. 15, 2006

(54) METHOD AND APPARATUS FOR REDUCING SOFT ERROR RATE IN SRAM ARRAYS USING ELEVATED SRAM VOLTAGE DURING PERIODS OF LOW ACTIVITY

(75) Inventors: Anthony Gus Aipperspach, Rochester, MN (US); David Howard Allen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/116,589

(22) Filed: Apr. 28, 2005

(51) Int. Cl.
*G11C 11/00* (2006.01)
(52) U.S. Cl. .................. 365/154; 365/156; 365/230.05
(58) Field of Classification Search ................ 365/154, 365/156, 230.05
See application file for complete search history.

(56) References Cited

U.S. PATENT DOCUMENTS

| | | | | |
|---|---|---|---|---|
| 4,879,690 A | * | 11/1989 | Anami et al. ............... | 365/201 |
| 5,303,190 A | * | 4/1994 | Pelley, III ............... | 365/189.11 |
| 5,523,966 A | * | 6/1996 | Idei et al. .................... | 365/156 |
| 6,026,011 A | * | 2/2000 | Zhang ......................... | 365/154 |
| 6,510,076 B1 | * | 1/2003 | Lapadat et al. ............. | 365/154 |

* cited by examiner

*Primary Examiner*—Anh Phung
(74) *Attorney, Agent, or Firm*—Robert R. Williams

(57) ABSTRACT

A voltage supplied to an SRAM (static random access memory) in an electronic system is controlled responsive a level of activity in the electronic system. If the level of activity is higher, the voltage is kept lower; if the level of activity, the voltage is increased, reducing soft error rate in the SRAM. For example, one indicator of the level of activity is how frequently the SRAM is accessed. If the SRAM is accessed less frequently, a higher voltage value is used to supply the SRAM than if the SRAM is accessed more frequently. A higher voltage provides a lower soft error rate (SER), but increases power dissipation. The SRAM dissipates less switching power when it is infrequently used and therefore a higher voltage value can be supplied to the SRAM during such times of infrequent use without causing excessive power dissipation by the electronic system.

21 Claims, 9 Drawing Sheets

METHOD AND APPARATUS FOR REDUCING SOFT ERROR RATE IN SRAM ARRAYS USING ELEVATED SRAM VOLTAGE DURING PERIODS OF LOW ACTIVITY

BACKGROUND OF THE INVENTION

1. Field of the Invention

The current invention generally relates to soft error rates in static random access (SRAM) memories. More in particular, the current invention relates to reducing soft error rate in SRAM memories.

2. Description of the Related Art

Electronic systems, and in particular computer systems, typically store a relatively large amount of information in static random access (SRAM) memories on one or more semiconductor chips. For example, a modern computer system might have a 128 KB (128 Kilobytes) of SRAM in a level-1 instruction cache, 128 KB in a level-1 data cache, and 2 MB (Megabytes) in a level-2 cache on a processor chip. Some electronic systems such as computer systems have one or more SRAM chips separate from a logic chip where the logic chip accesses data in the SRAM chips.

SRAM memory cells, i.e., the semiconductor devices on a semiconductor chip that store the "1"s and "0"s used in an SRAM are typically constructed of a number of field effect transistors (FETs), such as N-channel field effect transistor, NFET 1, shown in a side view in FIG. 1. Gate 2 is typically formed of a polysilicon material, and is often silicided (e.g., with titanium to make titanium silicide) to lower resistance of the gate. A thin gate oxide 3 separates gate 2 from an area 9 between a source 5 and a drain 4. NFET 1, and other FETs are formed on a semiconductor substrate, such as substrate 6, formed, in the exemplary drawing of FIG. 1, as a P-doped semiconductor.

During operation of an SRAM, the semiconductor chip is bombarded with high energy particles. For example, lead is often used for solder and other interconnection metallurgy, such as solder bumps used to connect a semiconductor chip to a module. Lead is subject to radioactive decay, resulting in alpha particles. A path 7 of a high energy particle (e.g., an alpha particle) is shown in FIG. 1. As the particle passes through the semiconductor, ionization of the semiconductor occurs, forming negative charges and positive charges. Substrate 6, shown as a P-material for exemplary purposes, is typically coupled to ground. Positive charges formed are attracted to and swept to the ground. Negative charges are similarly attracted to higher voltage regions on the semiconductor chip. Many NFET drains on a chip are at a high voltage, and negative charges will be swept to those drains. In an SRAM memory cell, constructed of two cross coupled inverters, each inverter made of an NFET and a P-channel FET (PFET), one inverter output is a "0" (gnd) and the other is at "1" (a positive supply voltage). FETs (PFETs and NFETs) in an SRAM cell are designed to be very small, in order to pack as many SRAM cells as possible into a given area. Because of the small widths of the FETs, the outputs of the inverters have relatively high impedance. A particle strike at or near an NFET drain may lower the voltage of the NFET drain to a voltage lower than a critical voltage that will cause the cell to change state as a result of the particle strike. A similar situation exists for PFETs. PFETs are placed in an N-well that is coupled to a positive voltage. A particle strike again causes ionization. Negative charges are swept to the positive voltage coupled to the N-well; positive charges are swept to lower voltages in the area of the particle strike, such as a PFET drain that is at "0". Analogous to the strike near the NFET drain described above, a particle strike near a PFET drain can raise the voltage of the PFET drain; if the PFET drain (i.e., an inverter output in an SRAM cell) is raised above a critical voltage, the SRAM cell will flip to the wrong value. The actual amount of charge swept to a node depends on the energy of the high energy particle, where it strikes relative to the node, and characteristics of the semiconductor.

A number of techniques have been used to reduce SRAM memory cells from being changed erroneously by particle strikes. These unwanted changes are called soft errors, and the rate they occur is called a soft error rate (SER).

A first technique used to reduce SER places resistors of relatively high value between the output of each inverter and the input of the other. This slows the regeneration of the latch in the SRAM memory cell, and allows the inverter that suffered the particle strike to recover before the voltage on the output of the inverter that suffered the high energy particle strike can propagate to the input of the other inverter and cause the other inverter to also change its output. Unfortunately, high value resistors in semiconductor structures tend to be relatively large. Also, they typically have a relatively large amount of parasitic capacitance that slows the process of writing data into the SRAM memory cell. Slower regeneration also degrades performance when writing operations to the SRAM memory cell.

A second technique to reduce SER adds capacitance coupled to the output of each inverter in the SRAM memory cell. Since a particle strike tends to cause a particular number of charged particles to be swept to the affected drain, and, since V=q/C, where V is voltage change, q is charge introduced by the ionization and swept to the affected drain, and C is capacitance, a larger capacitance translates into a smaller voltage change at the drain. However, adding capacitors causes a less dense SRAM memory cell, as well as poorer performance.

SOI (Silicon On Insulator) semiconductor technology dramatically reduces SER, but is a more expensive semiconductor process.

Adding ECC (Error Correction Code) provides for correction of soft errors, but increases the size of the array and can add delay to the read and write operations.

Using a higher voltage supply to the SRAM helps to reduce SER, but a higher fixed supply voltage results in higher power. Modern electronic systems and their semiconductor chips are becoming limited in performance by thermal limits. Coupling the chip or chips, including the SRAM, to a fixed supply voltage that is at or near a maximum allowable voltage for the chip is undesirable from a power and thermal standpoint.

Therefore, there is a need for a method and apparatus that provide for a reduction in SER without significantly increasing power dissipation, using a more expensive semiconductor process, or slowing performance of an SRAM.

SUMMARY OF THE INVENTION

The current invention teaches methods and apparatus that provide for reducing a soft error rate (SER) of a static random access memory (SRAM) in an electronic system.

In an embodiment an SRAM supply voltage is controlled by a sensor capable of measuring a level of activity in the electronic system. Power dissipation, and the resultant temperature, is one measure of the level of activity in the electronic system. In an embodiment, the sensor measures temperature. When the temperature is relatively hot, the first supply voltage is controlled to be lower than when the temperature is relatively cool.

In an embodiment, the SRAM voltage supply is controlled by detecting when the SRAM is idle, or is not being accessed frequently, and raising a supply voltage to the SRAM during times the SRAM is idle or is not being accessed frequently.

In an embodiment, if the SRAM is not accessed for a certain number of cycles, the SRAM supply voltage to the SRAM is increased. The SRAM supply voltage is dropped to a lower voltage when an access is made to the SRAM.

In an embodiment, if an SRAM access rate is above an access rate limit the supply voltage to the SRAM is set at a first voltage value; if the SRAM access rate is below the access rate limit the supply voltage to the SRAM is set at a second voltage value, the second voltage value higher than the first voltage value.

In an embodiment, the supply voltage of an SRAM is controlled responsive to an SRAM access rate using a designer specified VID (Voltage ID) relationship that specifies how to lower the supply voltage as the SRAM access rate increases.

DETAILED DESCRIPTION OF THE PREFERRED EMBODIMENTS

The invention will be described in detail with reference to the figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

The current invention teaches a method and apparatus to determine when a level of activity in an electronic system is relatively high or relatively low. During periods of time when the level of activity is relatively low, a voltage supply to an SRAM (Static Random Access Memory) can be raised to a higher voltage than when the level of activity is relatively high. Raising the supply voltage to the SRAM during the periods of time when the level of activity is relatively low can be done without incurring thermal problems, since power dissipated in the electronic system is less during such times when the level of activity is relatively low.

The level of activity in the electronic system can be inferred from a temperature measurement, since more power is dissipated when the electronic system is relatively active than when the electronic system is relatively inactive.

The level of activity in the electronic system can also be inferred by the level of accessing the SRAM. For example, observing when the SRAM is not being accessed or is being accessed at less than a predetermined access rate. Responsive to a determination that the SRAM is not being accessed or is being used less than the predetermined access rate, a power control causes a supply voltage to be temporarily raised until the SRAM is again accessed, or used more than a predetermined access rate.

Figure 2A:
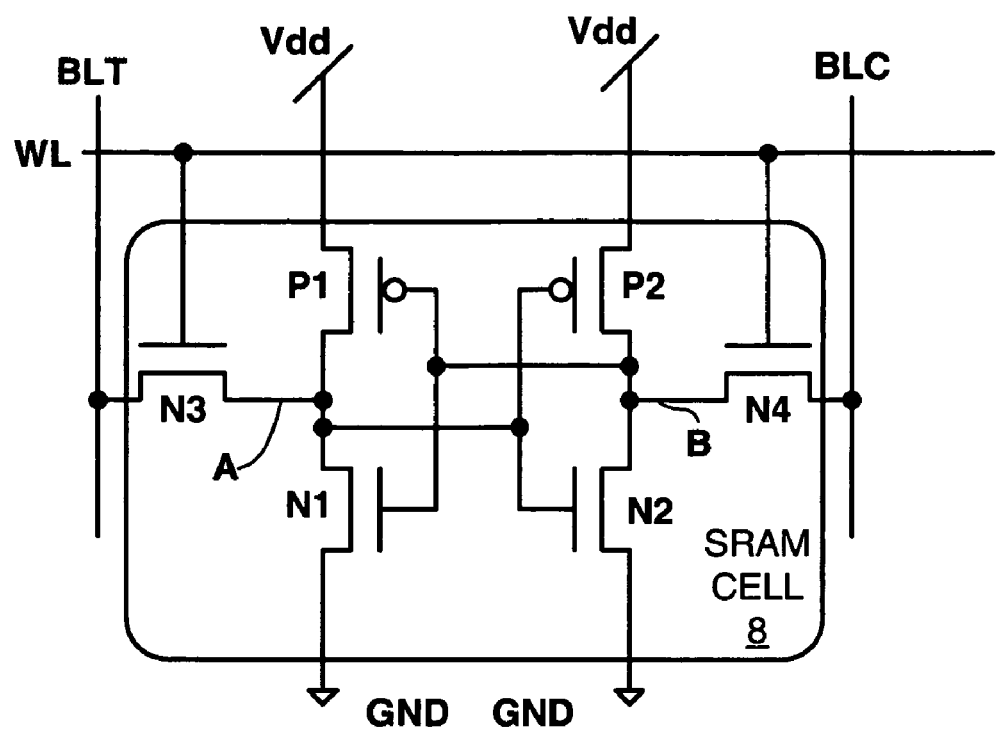
FIG. 2A shows an SRAM memory cell suitable for use in embodiments of the invention.

FIG. 2A shows SRAM memory cell 8, an exemplary SRAM memory cell suitable for use in embodiments of the present invention. A word line, WL, selects all SRAM memory cells in a "word" (a number of memory cells addressed in parallel, only one instance of an SRAM memory cell, SRAM memory cell 8, is shown in FIG. 2A). BLT (bit line true) and BLC (bit line complement) provide data to, and sense data from, a selected SRAM memory cell. Vdd is a supply voltage that is controlled, as will be explained in detail later. A first inverter, comprising NFET (N-channel field effect transistor) N1 and PFET (P-channel field effect transistor) P1 is cross coupled with a second inverter comprising NFET N2 and PFET P2. Sources of N1, N2 are coupled to Gnd (ground); sources of P1, P2 are coupled to Vdd. NFET N3 couples the output (i.e., drains of N1, P1) of the first inverter to BLT. NFET N4 couples the output (i.e., drains of N2, P2) of the second inverter to BLC.

Figure 2B:
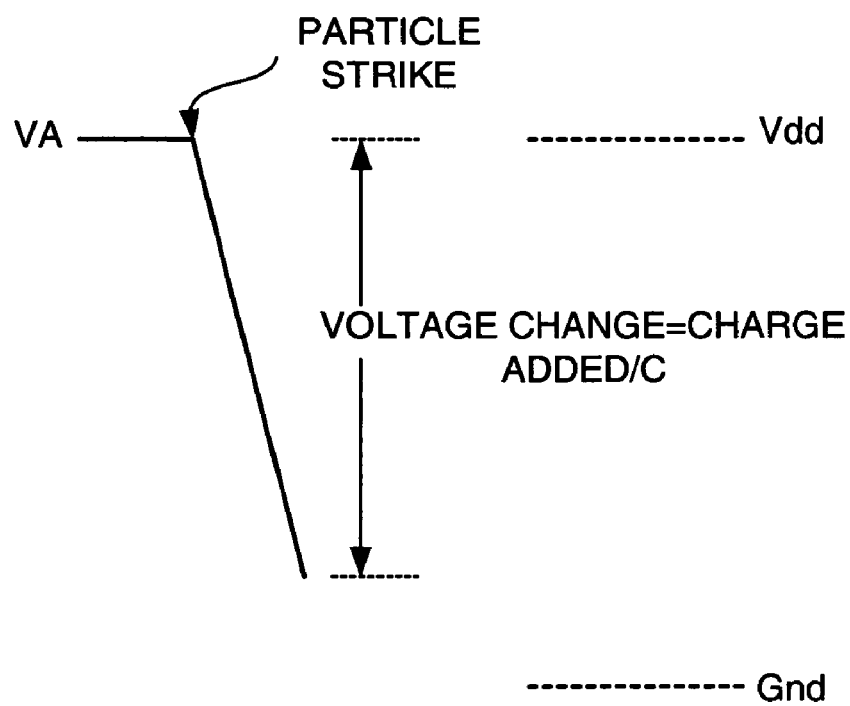
FIG. 2B illustrates a voltage change in a node in the SRAM memory cell of FIG. 2A resultant from a high energy particle strike.

FIG. 2B shows VA, a voltage at node A in FIG. 2A. Node A is the output of the first inverter of SRAM memory cell 8. VA is assumed to be at a "high" voltage initially. The high voltage is at or very near Vdd. A particle strike is shown to occur, placing an amount of negative charge on node A. The particle strike occurs at or near the drain of N1 or at or near the drain of N3. As explained earlier, the voltage on node A drops (i.e., voltage change) by the amount of negative charge swept to node A divided by the capacitance on node A. Capacitance on node A comprises parasitic capacitance associated with the interconnect wiring at node A and parasitic capacitances associated with N1, P1, N2, P2, and N3.

Figure 2C:
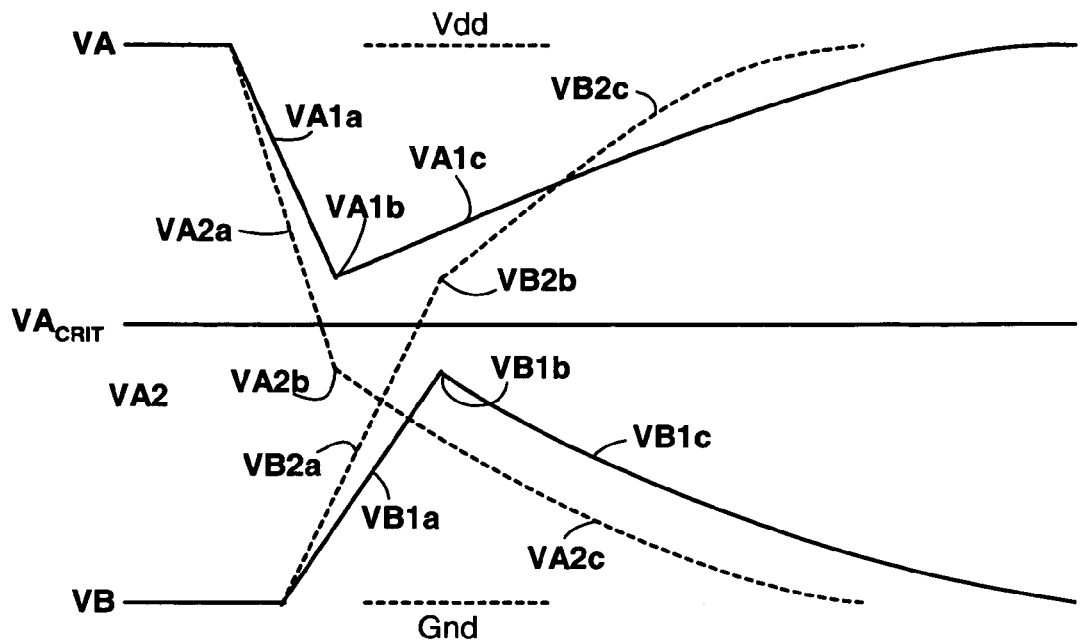
FIG. 2C illustrates a voltage on the outputs of both inverters in the SRAM memory cell of FIG. 2A resultant from two high energy particle strikes causing different amounts of voltage change on nodes in the SRAM memory cell.

FIG. 2C shows voltages at nodes A and B of SRAM memory cell 8. During a first strike of a first high energy particle causing a first amount of charge to be swept to node A; the voltage at node A, VA, is seen to drop (VA1a) according to the equation V=q/C to a lowest voltage point denoted as VA1b. The second inverter responds to the falling voltage on the output of the first inverter. Node B, having a voltage of VB is seen to begin at a low voltage (i.e., Gnd) and rise, responsive to VA1a, as shown as VB1a. Node B in this case, rises only to VB1b. VA1b is a higher voltage than a $VA_{CRIT}$. Node A is seen to recover toward Vdd as shown at VA1c. In response, Node B is seen to recover toward Gnd as shown at VB1c. However, a second, and slightly more energetic particle strike causing a second amount of charge higher than the first amount of charge to be swept to node A, or a strike by the second high energy particle at a location at which more of the charge is swept to node A, causes VA to drop as shown at VA2a. The voltage at node A drops below $VA_{CRIT}$, as shown at VA2b, a lower voltage than $VA_{CRIT}$. In response, node B rises at VB2a to VB2b, a higher voltage than $VA_{CRIT}$. Node A is seen to continue falling at VA2c to Gnd; Node B is seen to continue rising at VB2c to Vdd. The second high energy particle strike causes the SRAM cell to suffer a soft error.

Figure 2D:
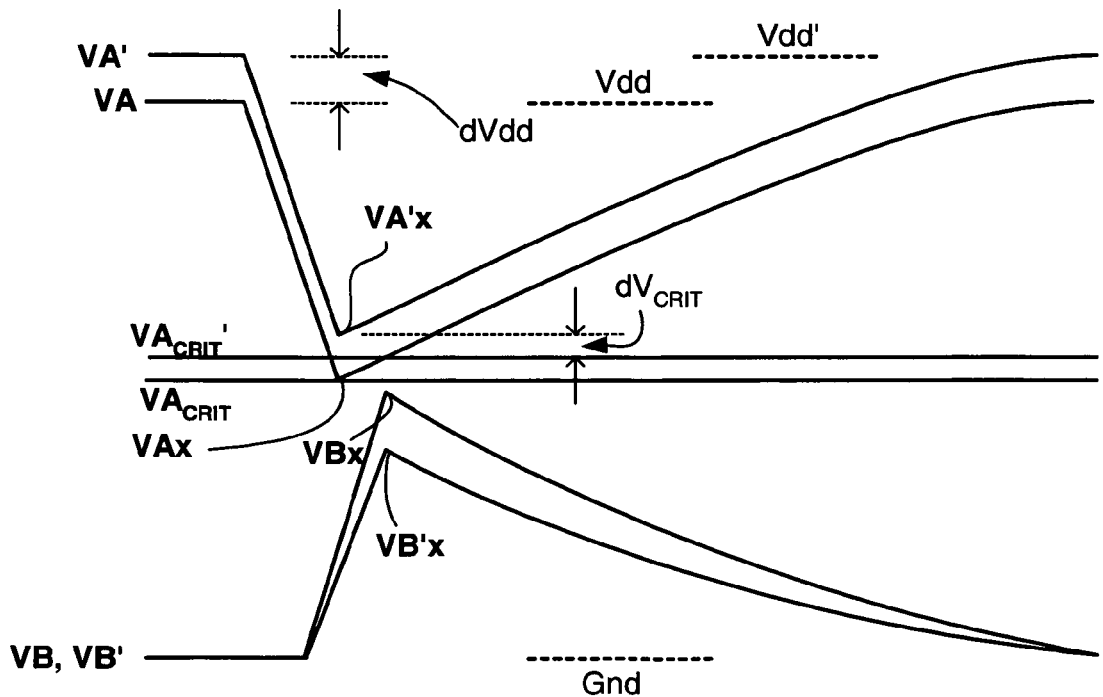
FIG. 2D illustrates how raising a supply voltage to an SRAM memory cell improves the SRAM memory cell's ability to tolerate a high energy particle strike.

FIG. 2D shows voltages at SRAM memory cell 8, nodes A and B. Two traces show Node A having a high energy particle strike of the same energy at the same location, but with different values of Vdd. VA shows the voltage of node A having a first value of Vdd. VB shows the voltage of node B having the first value of Vdd. The high energy particle strike causes node A, supplied at the first value of VDD, to drop to VAx, which is just equal to $VA_{CRIT}$ at the first value of Vdd. If VA were to be even slightly lower at VAx, a soft error would occur. VB is seen to rise to nearly $VA_{CRIT}$, and, if VA at VAx were to have been even slightly lower, VB would continue rising to the first value of Vdd, resulting in a soft error. Also shown in FIG. 2D is what happens when a high energy particle strike occurs, with the same amount of charge swept to node A, but when SRAM memory cell 8 is supplied by a second value of Vdd (designated Vdd' in FIG. 2D), the second value being higher than the first value by dVdd. For purposes of explanation, assume that the second value of Vdd is 10% greater than the first value of Vdd. At the second value of Vdd, the voltage node A, designated VA', is again shown at a high voltage (i.e., the second value of Vdd). The high energy particle strike causes the same voltage drop (i.e., same amount of capacitance and the same charge are assumed) for VA' as was seen in VA. However, the lowest VA' falls to is VA'x, which is a higher voltage than $VA_{CRIT}'$. Therefore operating at the higher voltage makes SRAM memory cell 8 more robust in avoidance of soft errors.

Continuing the example where the second voltage value of Vdd is 10% higher than the first voltage value of Vdd, assume that the first Vdd value is two volts; the second Vdd value is 2.2 volts. dVdd is therefore 0.2 volts. The value of $VA_{CRIT}$, and $VA_{CRIT}'$ is primarily determined by the design of the two inverters in SRAM memory cell 8; typically the two inverters are designed such that the value of $VA_{CRIT}$, and $VA_{CRIT}'$ is roughly half the Vdd voltage supplied (e.g., 1.0 volt and 1.1 volt, respectively). The actual value of $VA_{CRIT}$ is not critical to the invention, and the typical values of $VA_{CRIT}$ being roughly half of Vdd is used for exemplary purposes. Assume the two inverters are designed such that the critical voltage is half of Vdd. Therefore, $VA_{CRIT}$ would be 1.0 volts; $VA_{CRIT}'$ would be 1.1 volts in the example. When operating at the first value of Vdd, then, the voltage of node A can fall one volt before a soft error occurs (i.e., 2.0 v−1.0 v=1 v). When operating at the second value of Vdd, the voltage of node A can fall 1.1 volt before a soft error occurs (i.e., 2.2 v−1.1 v=1.1 v), improving soft error tolerance by 10% (that is, 10% more charge swept to node A can be tolerated) over the soft error tolerance when operating at the first value of Vdd. Alternatively, for the same soft error tolerance, 10% less capacitance is required. It will be understood, however, that if 10% less capacitance is used on nodes A and B, that SRAM memory cell 8 will be less robust against soft errors when SRAM memory cell 8 is operated at the lower Vdd value.

Current semiconductor chips are often power limited. The power limit might be caused by limited cooling capability, or might be limited by a desire to operate the electronic system for a long period of time on a battery charge. A switching portion of power dissipated in a semiconductor chip is dissipated by switching of capacitance, and is approximated by equation (1) below. Note that the switching portion of power dissipated varies as the square of Vdd.

$$\text{Power}=Vdd*Vdd*\text{Capacitance switched}*\text{frequency}*0.5. \quad (1)$$

Figure 1:
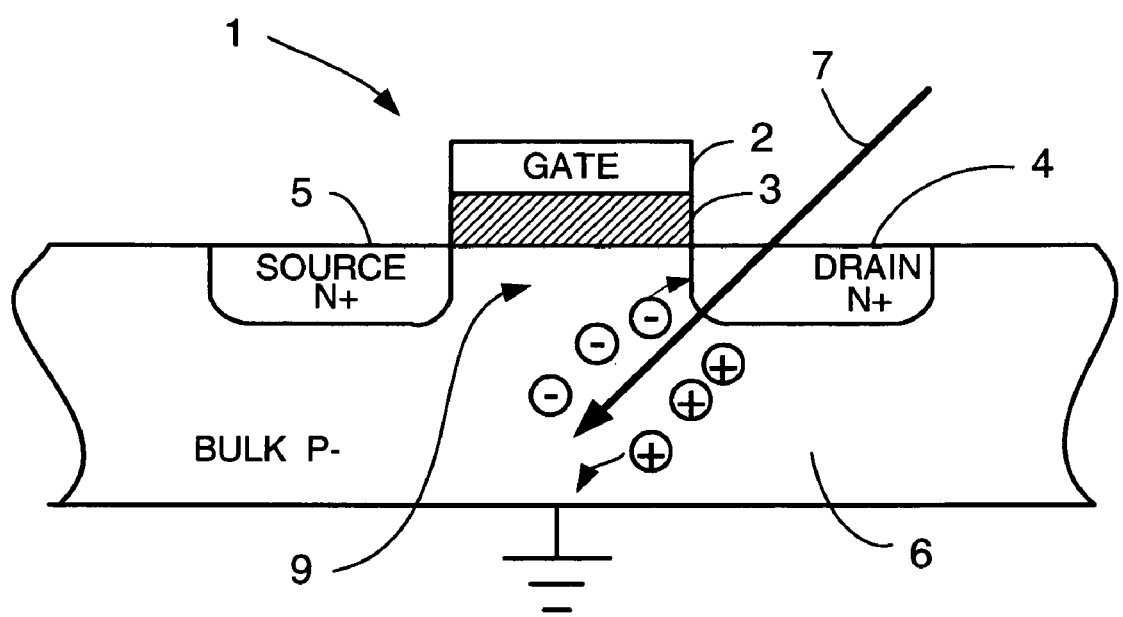
FIG. 1 is a prior art side view of a conventional N-channel field effect transistor, illustrating a high energy particle strike.

Modern semiconductor chip also have a significant component of power resulting from leakage. Gate oxides (such as gate oxide 3 in NFET 1, FIG. 1) have become thin enough that leakage occurs between the gate and the channel formed below the gate oxide. Because of power concerns, semiconductor chips are often not run at a maximum value of Vdd, the maximum value of Vdd determined by the particular semiconductor process used to manufacture the semiconductor chips.

Figure 3:
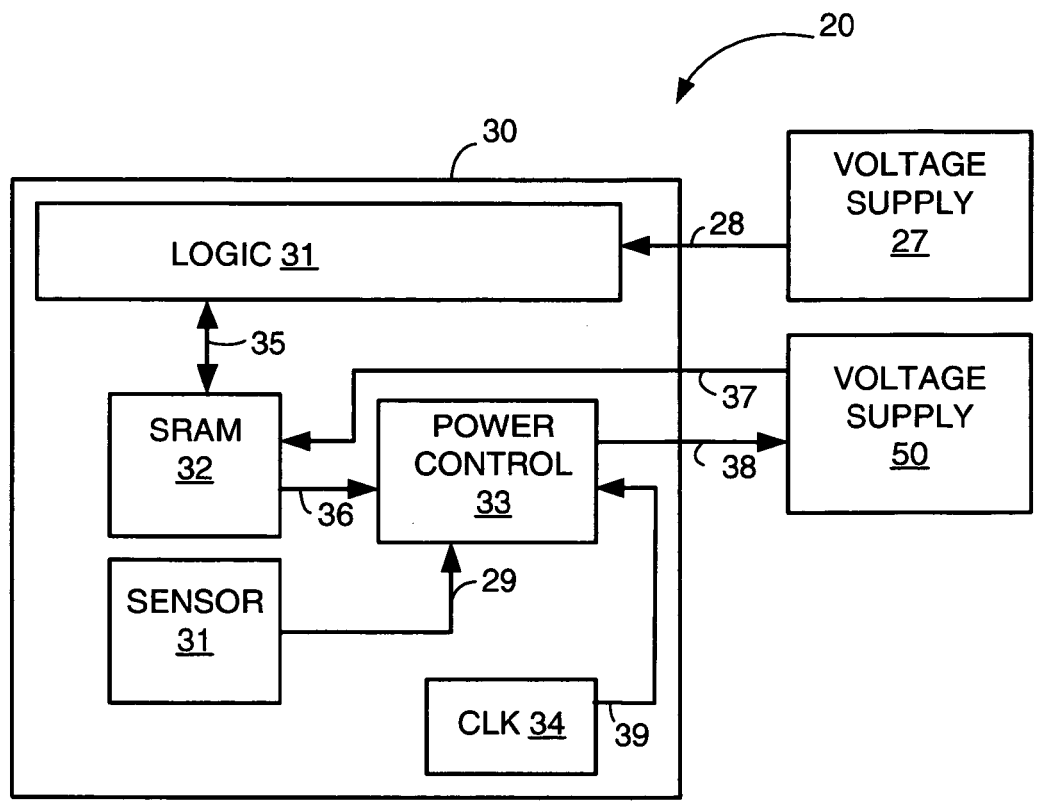
FIG. 3 shows a block diagram of an electronic system according to an embodiment of the invention.

FIG. 3 shows an electronic system 20 comprising a semiconductor chip 30, a voltage supply 27, and a voltage supply 50. It will be appreciated that electronic system 20 can be a computer system comprising a plurality of semiconductor chips 30, a personal digital assistant, or any other electronic system having SRAMs. It will be understood that all of the numbered elements in semiconductor chip 30 can be on a single semiconductor chip, or can be implemented on multiple semiconductor chips.

Semiconductor chip 30 has a logic 31 portion comprising circuitry that performs Boolean logic (e.g., an arithmetic logic unit, multiplexers, shifters, and the like), latches, registers, and input/output circuitry. Logic 31 is coupled to SRAM 32 by signal bus 35. It will be understood that, in an embodiment, SRAM 32 is fabricated on the same semiconductor chip as logic 31. In another embodiment, logic 31 comprises one or more semiconductor chips and SRAM 32 is fabricated on one or more separate semiconductor chips. The invention is not limited to one SRAM, and any number of SRAMs, including a single SRAM as shown, is within the spirit and scope of the present invention. SRAM 32 uses a Vdd voltage supplied on power bus 37; SRAM 32 is coupled to power control 33 by one or more signals 36. Power control 33 also receives a clock signal from clock 34, via signal 39. Clock 34 provides a clock signal at a frequency chosen by the designer. Clock 34, in an embodiment, also provides clock signals to latches in logic 31 (not shown). In an embodiment, power control 33 is coupled to a sensor 31 by signal(s) 29. Power control 33 outputs a first control signal 38 to voltage supply 50, first control signal 38 controlling a first Vdd voltage value supplied on power bus 37 supplied by voltage supply 50. It will be understood that Power control 33 and clock 34 may be physically fabricated on the same semiconductor chip as logic 31 and SRAM 32, or may be physically fabricated on separate semiconductor chips. Logic 31 is supplied by voltage supply 27 that is independent from voltage supply 50 using power bus 28.

Figure 4A:
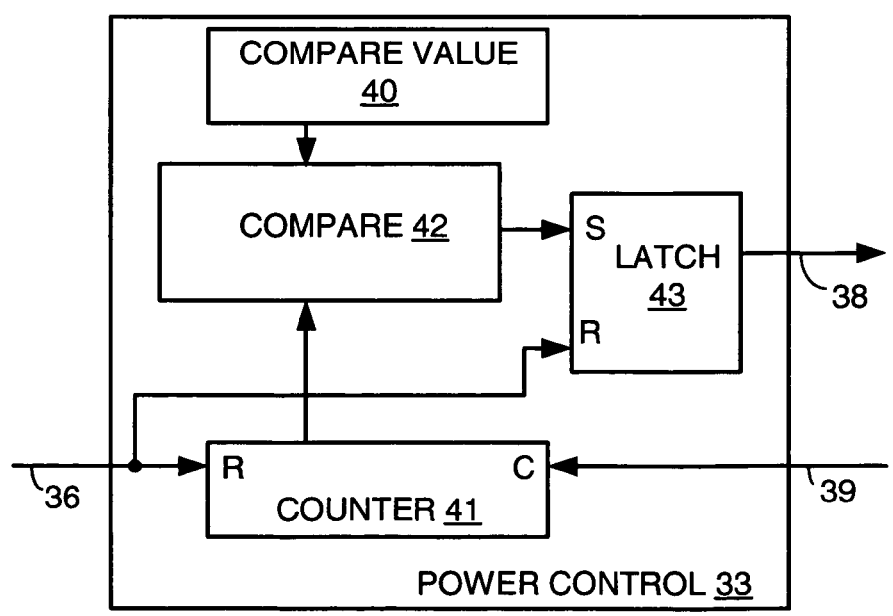
FIG. 4A shows a block diagram of a first embodiment of a power control suitable for use in the electronic system of FIG. 3.

A first embodiment of power control 33 is shown in FIG. 4A. This embodiment causes Vdd to be increased from the first voltage value to the second (higher) voltage value if a particular number of cycles of clock 34 have occurred without the SRAM 32 reporting an access on signal 36. The particular number of clock cycles (at a particular frequency) represents a time interval specified by the designer of electronic system 20. A compare value 40 is loaded during startup of electronic system 20, or, alternatively, is simply hardwired into compare value 40. For example, in a computer system embodiment of electronic system 20, a value is scanned or otherwise written into compare value 40. The value for the particular number of cycles is written into compare value 40 is chosen by the designer to satisfy the time interval according to the designer's requirements regarding power dissipated, and, perhaps, the designer's knowledge of applications that are run on electronic system 20. A large value will cause Vdd to be raised only if a relatively long time should be waited when SRAM 32 is not being accessed before Vdd will be raised. A counter 41 is clocked by signal 39, supplied from clock 34 (see FIG. 3). Counter 41 is reset by an access of SRAM 32, as indicated by a signal from SRAM 32 on signal 36. Suppose, for exemplary purposes, that a value of 1,024 ($2^{10}$) has been written into compare value 40. Suppose that clock 34 outputs on signal 39 a frequency of 1.024 KHz (kilohertz). If no accesses are made to SRAM 32 (i.e., the signal on signal line 36 remains inactive), the value in counter 41 will equal the value in compare value 40 in one second. When the value in counter 41 equals the value in compare value 40, a signal output by comparator 42 (which activates an output when the value in counter 41 equals the value in compare value 40) sets latch 43, and latch 43 produces an active signal on control signal 38, which, as shown in FIG. 3, is coupled to voltage supply 50. An active signal on control signal 38 will cause voltage supply 50 to raise the value of the voltage (Vdd) supplied to the SRAM 32 from a first voltage value to a second voltage value that is higher than the first voltage value. When the SRAM 32 is again accessed, an active signal on signal line 36 will reset counter 41 and also reset latch 43. As long as SRAM 32 is accessed in time periods shorter than needed for counter 41 to count up to the value in compare 40, Vdd will remain at the lower voltage value, keeping power dissipated in SRAM 32 at a lower value than if SRAM 32 were being operated at the higher voltage value.

Figure 4B:
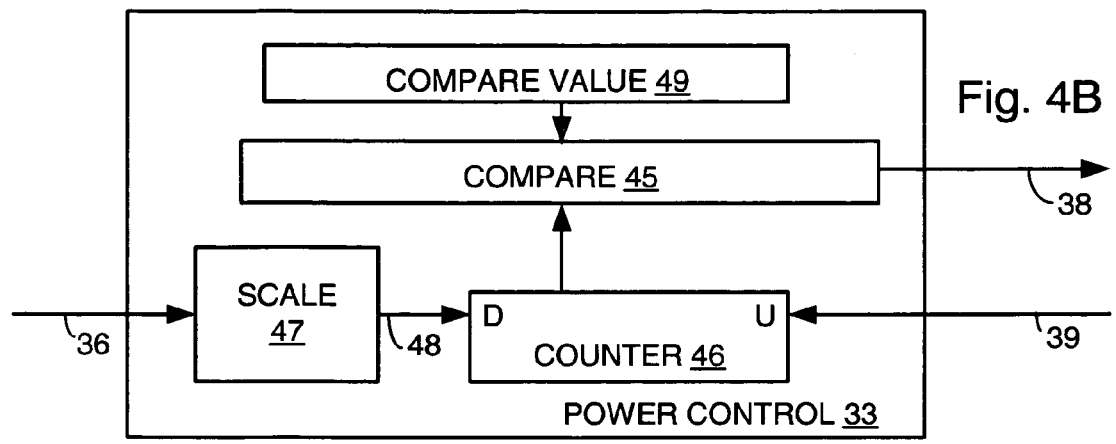
FIG. 4B shows a block diagram of a second embodiment of a power control suitable for use in the electronic system of FIG. 3.

A second embodiment of power control 33 is shown in FIG. 4B. In this embodiment, if an SRAM 32 is used at more than a predetermined access rate, the Vdd is set to a first voltage value; if the SRAM 32 is used less than the predetermined access rate, Vdd is set at a second voltage value. The first voltage value is less than the second voltage value.

Power control 33 in the embodiment of FIG. 4B has a compare value 49, that, like compare value 40 of FIG. 4B, is hardwired or written by other portions (not shown) of an electronic system based on a designer's choice of tradeoff between power dissipated in electronic system 20 and SER. Compare value 49 contains an access rate limit specified by the designer. A counter 46 counts up responsive to the clock signal on signal 39, output by clock 34. Counter 46 counts down responsive to a signal on signal 36, scaled by scale 47. For example, if the SRAM 32 can be accessed, at most, four times for each cycle of clock 34, in an exemplary embodiment, scale 47 is a divide by two circuits. That is, if the SRAM 32 is being used every time it can be used, counter 46 will count down at frequency "F", where "F" is the frequency of clock 34 (that is, during a period of time, "T", counter 46 will receive 2*F*T "count down" signals on signal 48, and 1*F*T "count up" signals on signal 39). If SRAM 32 is not being accessed at all, counter 46 will count up at frequency "F". If SRAM 32 is being accessed every other time it could be accessed, the value of counter 46 remains constant. Counter 46 is designed to not overflow. That is, counter 46 contains all "1"s, counter 46 remains all "1"s when receiving further "up" signals on signal 39. When counter 46 contains all "0"s, counter 46 remains at all "0"s despite further active signals on signal 48 to the "down count" input of counter 46. It will be appreciated that scale 47 determines how rapidly counter 46 counts down as the SRAM 32 is accessed.

In the above example, if scale 47 simply passed to line 36 directly, counter 46 would decrement four counts for every increment count. Comparator 45 is coupled to compare value 49 and to counter 46. Control signal 38 is activated when the value in counter 46 is greater than the value in compare value 49. Control signal 38 is therefore active responsive to the SRAM 32 being accessed at less than the predetermined access rate. It will be appreciated that, in embodiments, scale 47 is programmable, the degree of scaling, that is, the scaling factor, written into scale 47 by other portions of electronic system 20, such as logic 31 or is simply hardwired into scale 47.

A relatively low value of the access rate limit written into compare value 49 will cause power control 33 to activate control signal 38 after a relatively brief period of a low access rate of SRAM 32. A relatively high value of the access rate limit written into compare value 49 will cause control signal 38 not to be activated for a relatively long time, even if no accesses are made to SRAM 32. A relatively low value of the access rate limit written into compare value 49 will also cause control signal 38 to remain active for a relatively long period of time when the access rate of SRAM 32 increases. It will be understood that, for purposes of explanation, counter 46 counts up responsive to signals on signal 39 from clock 34, and counts down responsive to SRAM 32 being accessed, it is within the spirit and scope of the invention that counter 46 counts in a first direction responsive to signals on signal 39 from clock 34 and counts in a second responsive to SRAM 32 being accessed.

Figure 4C:
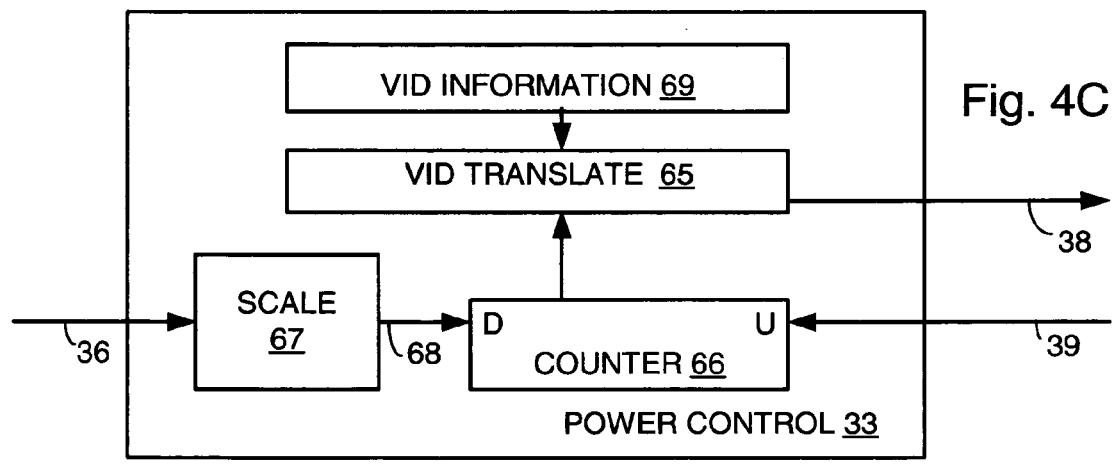
FIG. 4C shows a block diagram of a third embodiment of a power control suitable for use in the electronic system of FIG. 3.

FIG. 4C shows a third embodiment of power control 33. This embodiment provides for two or more values of Vdd that are selected based on a designer specified relationship between an SRAM access rate and the value of Vdd supplied to the SRAM. Scale 67, signal 68, counter 66 are similar to scale 47, signal 48, and counter 46 as described in reference to FIG. 4B. That is, counter 66 counts up responsive to clock signals from clock 34 (see FIG. 3) sent on signal 39. Counter 66 counts down responsive to SRAM accesses, as scaled by scale 67. At any point in time, therefore, the value of counter 66 contains a value of the SRAM access rate. VID information 69 is hardwired, or is written to from another part of electronic system 20, such as logic 31 (see FIG. 3), with information as to what Vdd should be versus SRAM access rate. Many modern voltage supplies receive a VID (voltage identification) from a semiconductor chip and provide a voltage that is controlled by the value transmitted on the VID. The VID is sent to the voltage supply using a plurality of bits. In this embodiment, to support a multibit VID to an embodiment of voltage supply 50 that supports VID, control signal 38 has a plurality of bits to send the VID to voltage supply 50. VID translate 65 uses the value of counter 66 and the information in VID information 69 to produce an output on control signal 38 that is the proper VID to be used by voltage supply 50. For example, Vdd supplied by voltage supply 50 for the SRAM might be variable from 2.0 volts to 2.2 volts. Counter 66 is shown as an eight bit up/down counter for exemplary purposes. Any number of bits in counter 66 is contemplated.

For example, VID information 69 specifies Vdd versus value in counter 66 according to table 1. An exemplary two-bit VID is used in table 1. VID information 69 contains a table, specified by the designer of electronic system 20, having the designer's desired relationship between the value in counter 66 and the VID value that will be output by VID translate 65. If the value in counter 66 is between 0 and 64, the SRAM access rate is relatively high, with the down counts (accesses reported on signal 36) dominating up counts (caused by clock 34 signals transmitted on signal 39), and Vdd is kept low, at 2.00 volts. As the SRAM access rate decreases, Vdd is increased according to the information specified in the table. When the SRAM access rate is very low, or zero, and contents of counter 66 become relatively high (above 192), 2.2 volts are supplied to SRAM 32. VID translate 65 controls power supply 50 to output the proper voltage according to the designer's SRAM access rate versus Vdd voltage specification. It will be understood that while the SRAM Vdd is shown, for exemplary purposes, as having four possible voltage values, any number of voltage values two or greater is within the spirit and scope of the invention.

TABLE 1

| Contents of counter 66 | VID | Vdd |
|---|---|---|
| 0 < 64 | 00 | 2.00 |
| 65 < 128 | 01 | 2.05 |
| 129 < 192 | 10 | 2.10 |
| 193 < 256 | 11 | 2.20 |

Figure 4D:
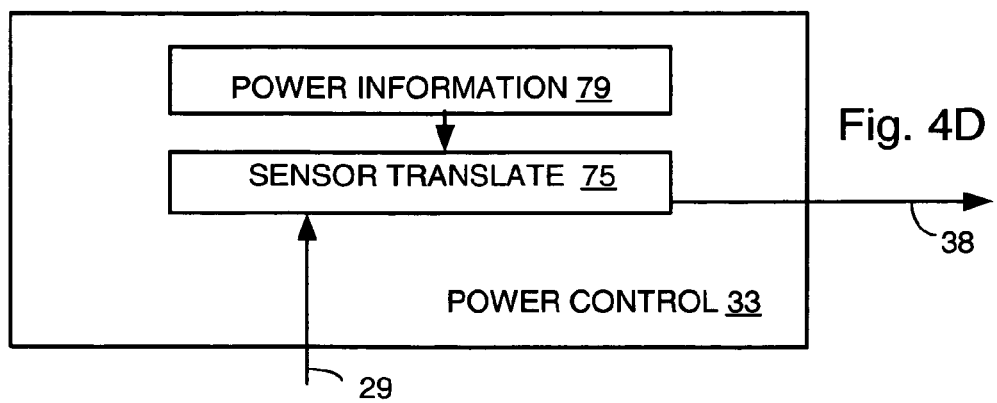
FIG. 4D shows a block diagram of a fourth embodiment of a power control suitable for use in the electronic system of FIG. 3.

FIG. 4D is a block diagram of a fourth embodiment of power control 33. In the fourth embodiment, a sensor signal 29 produced by sensor 31 is coupled to power control 33, and, responsive to a value on sensor signal 29, power control 33 controls the supply voltage used by SRAM 32. Sensor 31, in an embodiment, senses a temperature. For example, in an embodiment having logic 31 and SRAM 32 (shown in FIG. 3) on the same semiconductor chip, sensor 31 is also constructed on the same semiconductor chip.

Typically, logic 31 dissipates more power than SRAM 32. When logic 31 is heavily utilized (e.g., is seeing a heavy workload in a commercial or numerically intensive environment), logic 31 will dissipate more power than when logic 31 is lightly utilized (e.g., at night often a computer system is not being required to run many commercial transactions and/or is not running a numerically intensive computation). During times when the temperature is relatively cool, such as when logic 31 is not being heavily utilized, the supply voltage to SRAM 32 can be safely raised without causing excessive (exceeding a maximum specified temperature) temperatures on the semiconductor chip to occur. As explained earlier, SER is lower when the supply voltage to SRAM 32 is higher.

Temperature sensing on semiconductor chips is well known. For example, sensor 31, in an embodiment (not shown), comprises a forward biased diode. Forward biased diodes are known to have a well defined voltage versus temperature characteristic. In a second embodiment, sensor 31 is a ring oscillator comprising a number of blocks, such as inverters. A frequency of the ring oscillator will become slower as temperature increases in a predictable way for a given technology. Signal 29 from sensor 31 carries sensor information (e.g., temperature) to a sensor translate 75 in power control 33. A power information 79 contains designer specified information on how voltage is to be controlled responsive to the sensor information. Values are written into power information 79 when the electronic system is started, or, alternatively, the values in power information 79 are simply hardwired into power information 79. For example, if temperature is below 50 C (Celsius temperature), a higher value of SRAM Vdd can be used, and a signal is transmitted from sensor translate 75 on control signal 38 to cause voltage supply 50 to supply the higher value of SRAM Vdd to SRAM 32 on power bus 37 (see FIG. 3). If temperature is above 50 C (Celsius temperature), sensor translate 75 causes voltage supply 50 to cause a lower value of SRAM Vdd to be supplied to SRAM 32 on power bus 37 (see FIG. 3). Note that, an embodiment, sensor translate 75 drives VID information to voltage supply 50.

Figure 4E:
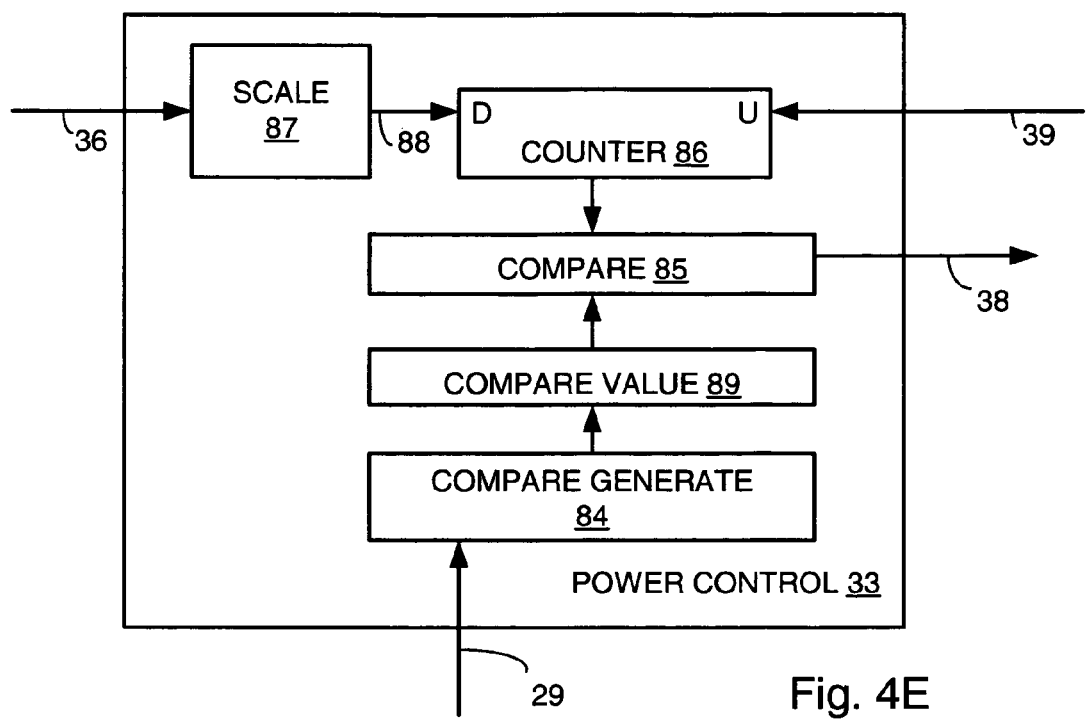
FIG. 4E shows a block diagram of a fifth embodiment of a power control suitable for use in the electronic system of FIG. 3.

A fifth embodiment of power control 33 is shown in FIG. 4E. In this embodiment, both the access frequency of SRAM 32 (SRAM 32 shown in FIG. 3) as well as information from sensor 31 (see FIG. 3) is used to determine the value of the SRAM voltage. Compare 85, counter 86, scale 87, and signal 88 perform the same functions as compare 45, counter 46, scale 47, and signal 48 as shown in FIG. 4B and described earlier. The value in compare value 49 of FIG. 4B was either hardwired, or written at startup time by another portion of the electronic system 20 (FIG. 3), such as logic 31 (FIG. 3). In the embodiment shown in FIG. 4E, sensor 31 (FIG. 3) sends information, such as temperature, on signal 29, to compare generate 84. Compare generate 84 periodically loads a value determined by the information compare generate receives on signal 29 into compare value 89. The value in compare value 89 is used by compare 85, along with a current value in counter 86, to determine when to activate control signal 38. As explained earlier in reference to FIG. 4B, counter 86 contains a relatively large value when up-counts dominate down-counts; that is, counter 86 contains a relatively large value when SRAM 32 is relatively inactive (not accessed frequently). Similarly, counter 86 contains a relatively small value when SRAM 32 is relatively active. If the electronic system is operated in a relatively cool environment, the SRAM voltage supply can, without causing excessive temperatures to be reached, be set at a higher voltage value more often, versus when the electronic system is operated in a relatively warm environment. Therefore, in the embodiment shown in FIG. 4E, compare generate 84 loads a relatively high value into compare value 89 responsive to sensor 31 reporting a relatively warm temperature on signal 29. Thus, when electronic system 20 is in a relatively warm environment, the voltage value supplied to SRAM 32 is "low" unless SRAM 32 is relatively inactive. If, on the other hand, sensor 31 reports a relatively cool temperature on signal 29, a relatively small value is loaded into compare value 89, and the voltage value supplied to SRAM 32 is "high" even when SRAM 32 is relatively active.

Figure 4F:
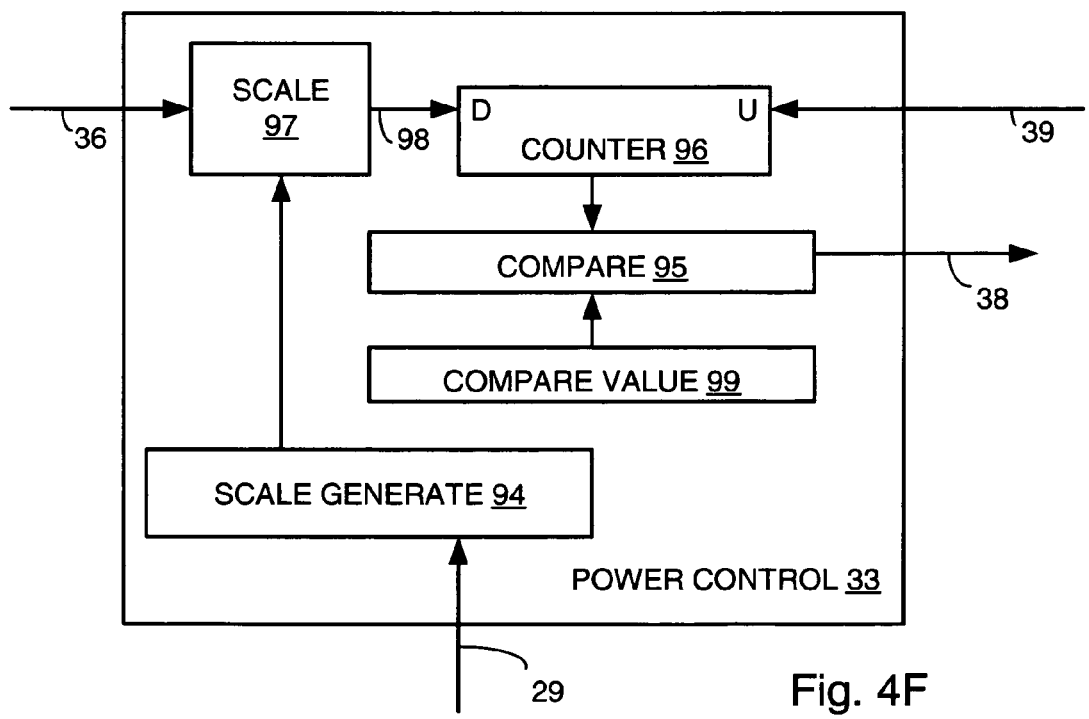
FIG. 4F shows a block diagram of a sixth embodiment of a power control suitable for use in the electronic system of FIG. 3.

FIG. 4F shows a sixth embodiment of power control 33. In this embodiment, a measurement by a sensor determines how rapidly power control 33 responds to a change in the activity level of SRAM 32. Compare 95, counter 96, scale 97, and signal 98 perform the same functions as compare 45, counter 46, scale 47, and signal 48 of FIG. 4B. Sensor 31 reports, for example, a temperature measurement, as described in reference to FIG. 4E. Scale generate 94, responsive to a value on signal 29, periodically updates a scaling factor in scale 97. As described in reference to FIG. 4B, if the scaling factor used in scale 97 is relatively "low", more frequent active levels will occur on signal 98 (i.e., active signals on signal 36 are counted down by a smaller number), and counter 96 will count down more quickly responsive to accesses of SRAM 32. When electronic system 20 is in a relatively "warm" environment, the designer would want the voltage value supplied to SRAM 32 to be reduced more quickly responsive to an increase in accesses to SRAM 32. Therefore, when the temperature reported via signal 29 is relatively "high", scale generate 94 writes a relatively low scaling factor into scale 97; when the temperature reported via signal 29 is relatively "low", scale generate 94 writes a relatively large scaling factor into scale 97.

It will be understood that the techniques described in reference to FIGS. 4E and 4F were taught using a simple "compare" (as taught earlier in reference to FIG. 4B), the techniques are equally useful using the multi-level voltage control system as taught in reference to FIG. 4C, i.e., a VID controller, capable of controlling the value of voltage supplied to SRAM 32 to two or more voltage values.

It will also be understood that the techniques described in reference to FIGS. 4E and 4F can be combined. That is, a power controller 33 can respond to temperature by both dynamically adjusting the scaling of the accesses to SRAM 32, and adjusting the compare value that is used with which to compare the value of the counter.

Six embodiments of power control 33 have been given. It will be understood that any power control 33 that observes a level of activity in electronic system 20 and causes a voltage supplied to an SRAM 32 to be increased during periods of relative inactivity in an electronic system is within the spirit and scope of the present invention.

Figure 5A:
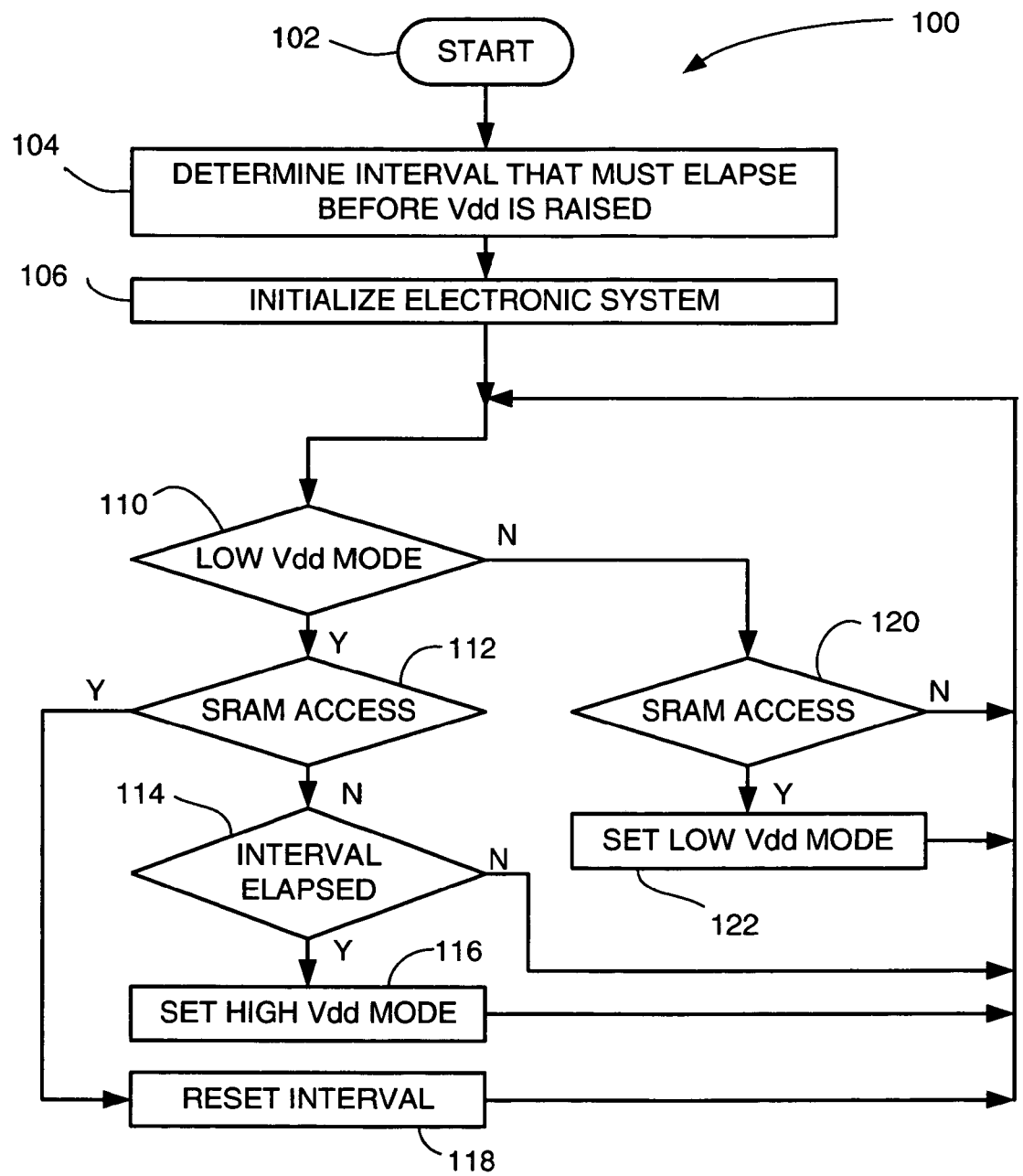
FIG. 5A shows a flow chart of a first method embodiment of the invention.

FIG. 5A is a flow chart of a method 100 embodiment of the invention. Method embodiment 100 corresponds to an embodiment of electronic system 20 further comprising the power control 33 embodiment of FIG. 4A.

Method 100 begins at step 102. Step 104 determines a time interval that must elapse before a Vdd supplied to an SRAM is raised from a first voltage value to a second voltage value that is higher than the first voltage. The time interval is chosen by the designer based on considerations of how the designer wishes to trade off power dissipated against tolerance of high energy particle strikes. A shorter time interval increases power of the electronic system, but increases tolerance of high energy particle strikes, that is, reduces a serial error rate (SER).

In step 106, the electronic system is initialized. During step 106, a value is written into compare value 40 (FIG. 4A) in embodiments where compare value 40 is programmable. In embodiments where compare value 40 contains hardwired information, that information is hardwired into compare value 40 when the semiconductor chip is manufactured. A counter (e.g., counter 41C in FIG. 4A) is reset.

In step 110, if the Vdd supplied to the SRAM is at a first (lower) voltage (e.g., signal 38 in FIG. 4A is inactive), control flows to step 112. Step 112 checks if the SRAM has been accessed since the last time step 112 was executed; if yes, control passes to step 118; if no, control passes to step 114. Step 118 resets a counter that measures if the interval has elapsed. Control passes from step 118 back to step 110.

Step 114 checks to see if the interval has elapsed. That is, the counter is compared to the interval determined in step 104. If the interval has not elapsed, step 114 transfers control to step 110. If the interval has elapsed, control passes to step 116, which causes Vdd to be set to the second, higher, voltage value. Step 116 then transfers control to step 110.

If step 110 determines that Vdd is set at the second (higher) voltage value, control passes to step 120. Step 120 determines whether an access to the SRAM has occurred since the last time step 120 was performed. If not, step 120 transfers control to step 110. If step 120 determines that an access to the SRAM has occurred since the last time step 120 was performed, control is transferred to step 122. Step 122 causes Vdd to be set to the first (lower) voltage value. Step 122 then transfers control to step 110.

Figure 5B:
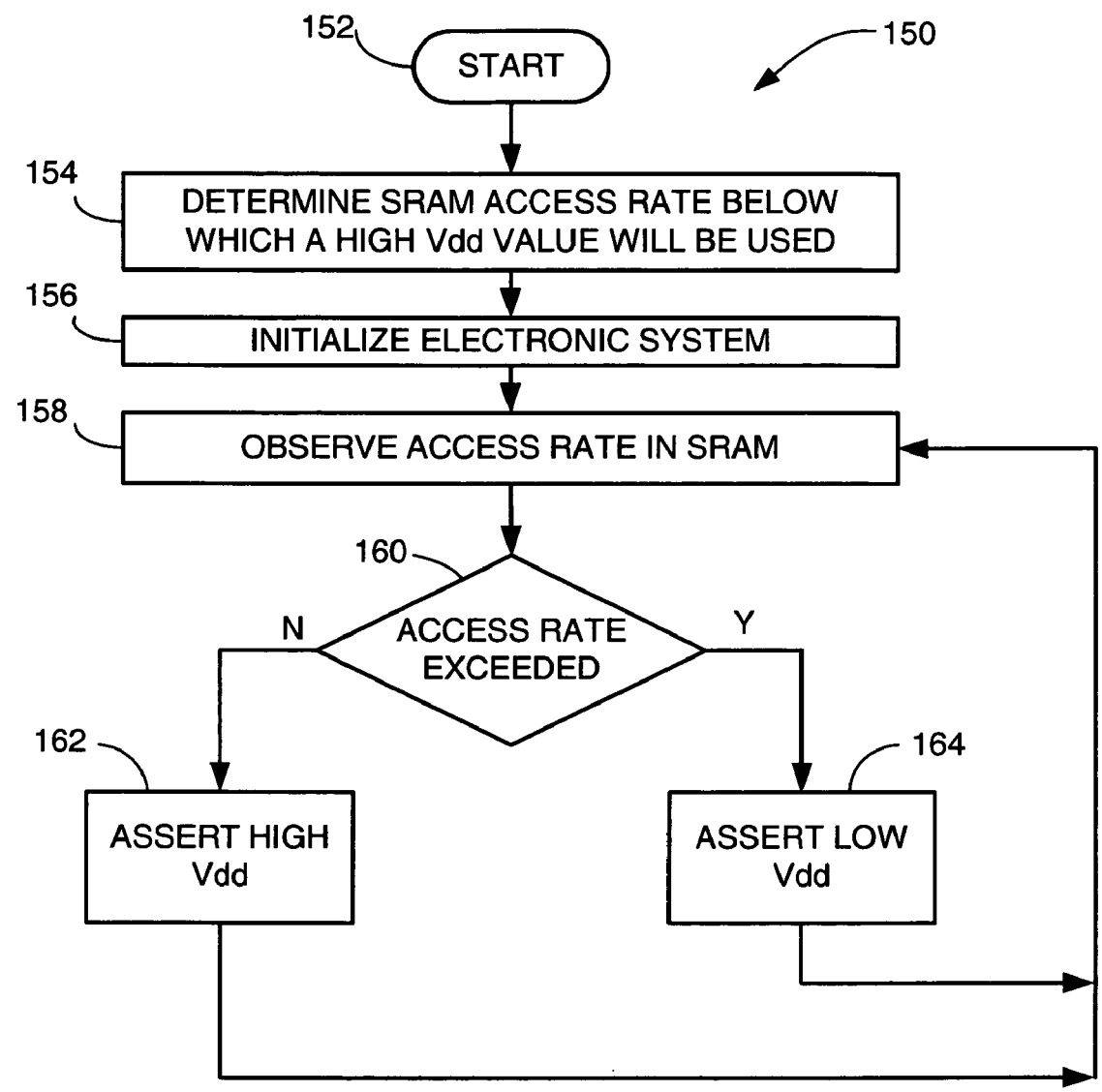
FIG. 5B shows a flow chart of a second method embodiment of the invention.

In a method 150 embodiment of the invention, shown in FIG. 5B, using the power control shown in FIG. 4B, a Vdd supplied to an SRAM is determined by an access rate to the SRAM. If the access rate to the SRAM is above an access rate limit, Vdd will be at a first voltage value. If the access rate to the SRAM is below the access rate limit, Vdd will be at a second voltage value that is higher than the first voltage value.

Step 152 begins method 150. In step 154 an SRAM access rate limit above which a first Vdd value is supplied to an SRAM in an electronic system, and below which a second Vdd value is supplied to the SRAM is determined. A designer of an electronic system determines the SRAM access rate limit based upon power versus tolerance of strikes by high energy particles considerations. If power is of no concern, that is, ample power supplies and cooling are available, and if cost of electricity is secondary to a lower soft error rate (SER), the higher Vdd value would be used much, or all, of the time and the access rate limit would be set relatively high. However, if power or cooling is a concern, the designer would choose a low SRAM access rate limit in his/her design, accepting a higher SER in order to reduce power in the electronic system.

In step 156, initialization of the electronic system is performed, including writing the SRAM access rate limit into a power control for embodiments having a programmable SRAM access rate. Counters, such as counter 46 shown in FIG. 4B are initialized. In embodiments having a programmable scale, such as scale 47 in FIG. 4B, the scaling value is initialized.

Step 158 observes an access rate on the SRAM. In step 160, if the SRAM access rate on the SRAM exceeds the SRAM access rate limit, control is transferred to step 164, which causes the first (lower) voltage value to be used for Vdd. Step 164 transfers control to step 158. If the SRAM access rate does not exceed the access rate limit, control is passed from step 160 to step 162 which causes the second (higher) voltage value to be used for Vdd. Step 162 transfers control to step 158.

Figure 5C:
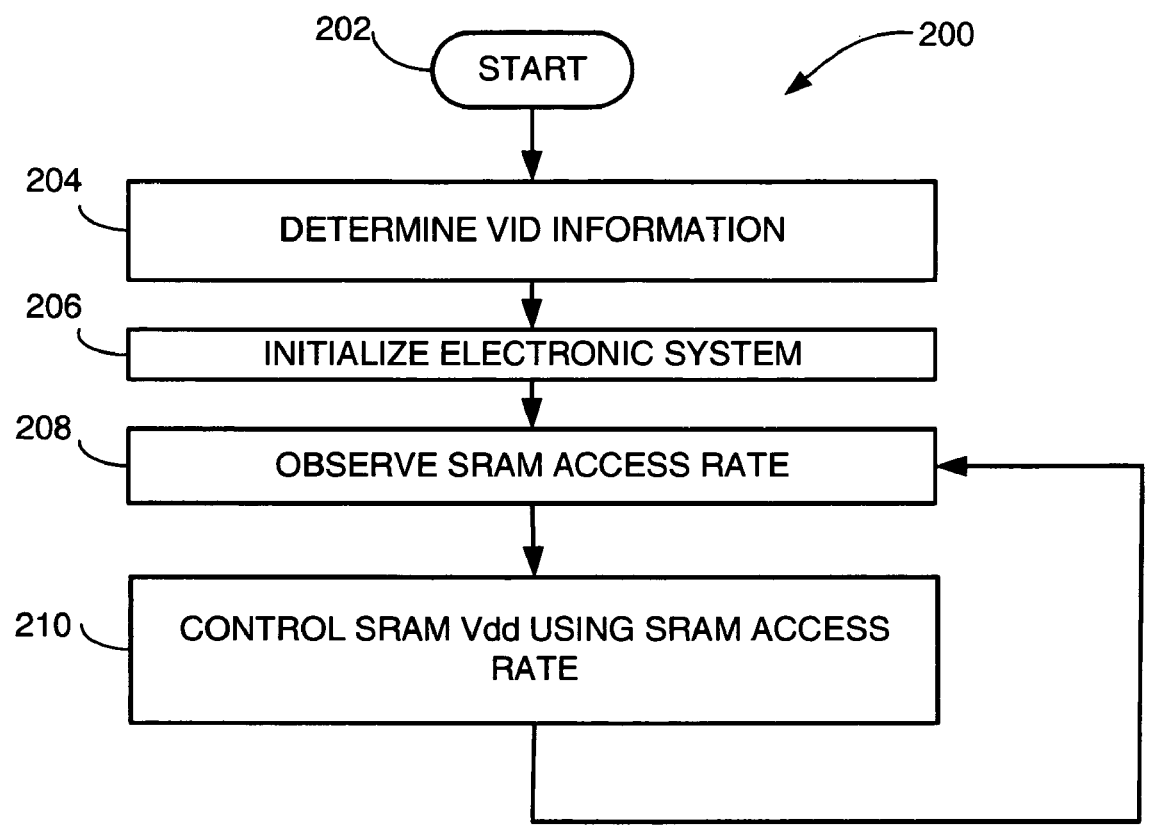
FIG. 5C shows a flow chart of a third method embodiment of the invention.

FIG. 5C is a flow chart of a method embodiment 200 of the invention suitable when an electronic system (e.g., electronic system 20 of FIG. 3) uses an embodiment of power control 33 as shown in FIG. 4C.

Step 202 begins method 200. In step 204, VID information is determined by the designer of the electronic system, as described above relevant to FIG. 4C. In step 206, an electronic system is initialized, including writing the VID information into a power control in the electronic system. The VID information, in an embodiment, is stored in tabular form, specifying a voltage value for Vdd versus an SRAM access rate. In step 208, an SRAM access rate is observed. It will be understood than the VID information stored in VID information 69 and the embodiment of VID translate 65 can be embodied in many forms. For example VID information 69 can be coefficients of an equation that is executed by VID translate 65. In step 210, a voltage value of Vdd supplied to the SRAM is controlled responsive to the SRAM access rate and the VID information.

What is claimed is:

1. An electronic system comprising:
   an SRAM (static random access memory); and
   a voltage supply that supplies a voltage to the SRAM;
   wherein a voltage value of the voltage supplied to the SRAM is dependent upon a level of activity in the electronic system.

2. The electronic system of claim 1, wherein the level of activity in the electronic system is a level of SRAM access activity.

3. The electronic system of claim 2, further comprising:
   a power control that receives a signal from the SRAM that is active when the SRAM is accessed, the power control further coupled to the voltage supply such that the power control controls the voltage value supplied to the SRAM; and
   a clock that outputs a clock signal at a specified frequency.

4. The electronic system of claim 2, wherein the voltage value supplied to the SRAM is at a first voltage value if the SRAM has been accessed within a specified time interval, and the voltage value supplied to the SRAM is at a second voltage value, higher than the first voltage value if the SRAM has not been accessed within the specified time interval.

5. The electronic system of claim 3, wherein if the power control receives a number of clock signals corresponding to the specified time interval before receiving the signal from the SRAM, the power control controls the voltage to the SRAM to be at the second voltage value, and wherein the power control controls the voltage to the SRAM to be at the first voltage value upon receiving the signal from the SRAM.

6. The electronic system of claim 2, wherein the voltage value supplied to the SRAM is controlled to be at a first voltage value if the SRAM is being accessed at a rate greater than a specified access rate limit, and wherein the voltage value supplied to the SRAM is controlled to be at a second voltage value if the SRAM is being accessed at a rate less than the specified access rate limit, the second voltage value being higher than the first voltage value.

7. The electronic system of claim 5, further comprising:
   a counter coupled to the clock and further coupled to the signal from the SRAM, the counter counting in a first direction responsive to the clock and counting in a second direction responsive to the signal from the SRAM; and
   a comparator that compares a value in the counter against the specified access rate limit, the voltage supply controlled by an output of the comparator.

8. The electronic system of claim 6, wherein the specified access rate limit is programmable.

9. The electronic system of claim 6, further comprising:
   a scale having a scaling factor coupled to the signal from the SRAM and to the counter, the scale outputting a signal to the counter that is a scaled frequency of the signal from the SRAM.

10. The electronic system of claim 8, wherein the scaling factor is programmable.

11. The electronic system of claim 2, wherein the voltage value supplied to the SRAM is controlled to be at one of at least three values, dependent upon an SRAM access rate.

12. The electronic system of claim 10, further comprising:
    a counter coupled to the clock and further coupled to the signal from the SRAM, the counter counting in a first direction responsive to the clock and counting in a second direction responsive to the signal from the SRAM; and
    a VID (voltage identification) translate that uses designer specified information and a value of the counter to determine which of the at least three values of the voltage value supplied to the SRAM is to be used.

13. The electronic system of claim 11 further comprising:
    a scale having a scaling factor coupled to the signal from the SRAM and to the counter, the scale outputting a signal to the counter that is a scaled frequency of the signal from the SRAM.

14. The electronic system of claim 11, wherein the scaling factor is programmable.

15. The electronic system of claim 1 further comprising a sensor capable of making a first measurement of the level of activity in the electronic system;
    wherein the voltage value of the voltage supplied to the SRAM is controlled responsive to the first measurement.

16. The electronic system of claim 15, further comprising a second measurement of the level of activity in the electronic system, the second level of activity being a measurement of access frequency of the SRAM;
    wherein the voltage value of the voltage supplied to the SRAM is controlled responsive to both the first measurement and the second measurement.

17. The electronic system of claim 16, wherein the first measurement is a measurement of temperature.

18. A method of controlling a voltage supplied to an SRAM responsive to how frequently the SRAM is accessed, comprising the steps of:
    supplying the SRAM with a first voltage value when the SRAM is used more frequently; and
    supplying the SRAM with a second voltage higher than the first voltage value when the SRAM is used less frequently.

19. The method of claim 18, further comprising the steps of:
    determining a time interval that must elapse without the SRAM being accessed, after which the SRAM is supplied with the second voltage value;
    upon the SRAM not being accessed for the time interval, supplying the SRAM with the second voltage value; and
    upon the SRAM being accessed, supplying the first voltage value until the time interval has elapsed without the SRAM being accessed.

20. The method of claim 19, further comprising the steps of:
    determining an SRAM access rate limit;
    observing an access rate for the SRAM;
    if the access rate is exceeded, supplying the SRAM with the first voltage value; and
    if the access rate is not exceeded, supplying the SRAM with the second voltage value.

21. The method of claim 18, further comprising the steps of:
    observing an SRAM access rate for the SRAM;
    supplying the SRAM with the first voltage value if the SRAM access rate is above a first access rate value;
    supplying the SRAM with the second value if the SRAM access rate is greater than the first access rate value but less than a second access rate value; and
    supplying the SRAM with a third voltage value higher than the second voltage value if the SRAM access rate is greater than the second access rate value.

* * * * *